US012622173B2

(12) United States Patent
Baek et al.

(10) Patent No.: US 12,622,173 B2
(45) Date of Patent: May 5, 2026

(54) SEMICONDUCTOR SUBSTRATE WITH OXIDE SINGLE CRYSTAL HETEROSTRUCTURES, MANUFACTURING METHOD THEREOF AND ELECTRONIC DEVICE USING THE SAME

(71) Applicant: KOREA INSTITUTE OF SCIENCE AND TECHNOLOGY, Seoul (KR)

(72) Inventors: Seung Hyub Baek, Seoul (KR); Ruiguang Ning, Seoul (KR); Jae-Hoon Han, Seoul (KR); Byung Chul Lee, Seoul (KR); Jungho Yoon, Seoul (KR); Hyun-Cheol Song, Seoul (KR); Seong Keun Kim, Seoul (KR); Chong Yun Kang, Seoul (KR); Ji-Won Choi, Seoul (KR); Jin Sang Kim, Jeollabuk-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 997 days.

(21) Appl. No.: 17/839,207

(22) Filed: Jun. 13, 2022

(65) Prior Publication Data

US 2023/0010061 A1 Jan. 12, 2023

(30) Foreign Application Priority Data

Jul. 6, 2021 (KR) ........................ 10-2021-0088485

(51) Int. Cl.
*H01L 41/313* (2013.01)
*H01L 41/08* (2006.01)
(Continued)

(52) U.S. Cl.
CPC ......... *H10N 30/073* (2023.02); *H10N 30/706* (2024.05); *H10N 30/8536* (2023.02); *H10N 30/8548* (2023.02); *H10N 30/8561* (2023.02)

(58) Field of Classification Search
CPC ............ H10N 30/073; H10N 30/8536; H10N 30/8548; H10N 30/8561
(Continued)

(56) References Cited

U.S. PATENT DOCUMENTS 6,111,284 A * 8/2000 Sakurai ................. H01L 21/022
257/295
2005/0128675 A1* 6/2005 Wang ................. H10N 30/8554
361/271
(Continued)

FOREIGN PATENT DOCUMENTS

JP 2013251490 A 12/2013
KR 2003-0070295 A 8/2003
(Continued)

OTHER PUBLICATIONS

Santoru Kaneko et al., "Effect of Buffer Layer on Epitaxial Growth of YSZ Deposited on Si Substrate by Slower Q-switched 266 nm YAG Laser", Japanese Journal of Applied Physics, 2004, pp. 1532-1535.

*Primary Examiner* — Emily P Pham
*Assistant Examiner* — Monica Mata
(74) *Attorney, Agent, or Firm* — NKL LAW; Jae Youn Kim

(57) ABSTRACT

A semiconductor substrate with oxide single crystal hetero-structures, to which a sacrificial layer, an epitaxy functional oxide thin film having a perovskite structure and a metal layer are grown on an oxide single crystal substrate, pre-pared another metal layer on a semiconductor substrate, and bonded the metal layer of the oxide single crystal substrate to the metal layer of the semiconductor substrate to be face each other, and separated the oxide single crystal substrate by selectively etching and removing only the sacrificial layer after the bonding.

13 Claims, 9 Drawing Sheets

(51) Int. Cl.
   *H01L 41/187*      (2006.01)
   *H10N 30/00*       (2023.01)
   *H10N 30/073*      (2023.01)
   *H10N 30/853*      (2023.01)

(58) Field of Classification Search
   USPC ......................................................... 310/358
   See application file for complete search history.

(56)                    References Cited

U.S. PATENT DOCUMENTS

| | | | |
|---|---|---|---|
| 2005/0199924 A1* | 9/2005 | Fox ......................... | H10D 1/682 |
| | | | 257/295 |
| 2005/0218466 A1* | 10/2005 | Kondo .............. | H01L 21/02304 |
| | | | 257/415 |
| 2022/0329230 A1* | 10/2022 | Tai ........................ | H10N 30/871 |

FOREIGN PATENT DOCUMENTS

| | | |
|---|---|---|
| KR | 10-1582247 B1 | 1/2016 |
| KR | 2018-0051602 A | 5/2018 |

* cited by examiner

AFTER TRANSFERRING
PMN-PZT/Au&Ti(METAL BONDING LAYER)/Si(SUBSTRATE)

SEMICONDUCTOR SUBSTRATE WITH OXIDE SINGLE CRYSTAL HETEROSTRUCTURES, MANUFACTURING METHOD THEREOF AND ELECTRONIC DEVICE USING THE SAME

CROSS-REFERENCE TO RELATED APPLICATION

This application claims priority to Korean Patent Application No. 10-2021-0088485, filed on Jul. 6, 2021 in the Korean Intellectual Property Office, the entire contents of which are hereby incorporated by reference.

BACKGROUND OF THE INVENTION

Field of the Invention

The present invention relates to a semiconductor substrate with oxide single crystal heterostructures, a manufacturing method thereof, and an electronic device using the same, and more specifically, to a semiconductor substrate with oxide single crystal heterostructures to which an epitaxy oxide thin film layer is bonded using a metal layer formed on a semiconductor substrate, a method of manufacturing the semiconductor substrate with oxide single crystal heterostructures in such a manner as to grow a sacrificial layer and an epitaxy oxide thin film having a perovskite structure on an oxide-single crystal substrate through vacuum deposition, then form a metal layer, prepare another metal layer on a semiconductor substrate, and bond the metal layer of the oxide single crystal substrate to the metal layer of the semiconductor substrate to be face each other, and perform separation of the oxide single crystal substrate by selectively etching and removing only the sacrificial layer after the bonding, and an electronic device using the semiconductor substrate with oxide single crystal heterostructures.

Description of the Related Arts

Since an oxide composed of a combination of oxygen and one or more metal ions has various kinds of functionality, it can be applied to a device, such as an electric device, an electronic device, a magnetic device, an optical device, an energy device, and so on.

In general, a physical property of the oxide has most excellent when it has a single crystal form, and in case that this oxide of high quality is applied to a device, it is possible to develop an electronic instrument having epoch-making capability and ability that did not exist before.

Since most electronics industries have been currently accomplished based on a silicon material, it has been very high to need technologies for combining a functional oxide of high quality with a silicon substrate.

The single crystal oxide is applied to a method of manufacturing a bulk single crystal using Bridgman's method or a solid-state single crystal growth method, and so on, and a method of manufacturing a single crystal thin film with the form of an epitaxy oxide thin film using a sputtering process, a chemical vapor deposition (CVD) process, a zol-gel process, and so on.

Meanwhile, in most electronics industries, since the development of technologies has been carried out on the basis of the development of devices of micro and nano scales, it would be preferable that a functional oxide to be used has the form of a thin film rather than a bulk.

As a part of this effort, as disclosed in Non-Patent Document 1, it reports an effect of a buffer layer on epitaxial growth of yttria-stabilized zirconia (YSZ) deposited on SiO2/Si (001) substrate to be matched with a crystal structure of YSZ (001) shown after deposition of the YSZ buffer layer, and in addition to this, in order to form a functional oxide single crystal thin film on a silicon substrate, the development of various buffer layers, such as YSZ, $SrTiO_3$, and so on has been carried out. However, it is problematic in that the grown epitaxy oxide thin film has a very high defective density compared to that of a silicon single crystal due to a difference in crystal structure and combination feature of atoms.

Furthermore, it is very difficult to control a crystal orientation of the epitaxy oxide thin film through direct growth. For example, it is problematic in that it is impossible to deposit a perovskite functional oxide with an orientation of (110) plane or (111) plane on the Si substrate of (001) plane using a direct growth method, or even if it is deposited, crystallinity is very poor.

Nevertheless, since physical properties of the functional oxide are largely influenced by the crystal orientation, a technology to form a functional oxide having various orientations on a semiconductor substrate is very important.

Patent Document 1 discloses an invention relating to a method of manufacturing a semiconductor substrate and a method of manufacturing a semiconductor apparatus, and reports that it is possible to manufacture a semiconductor substrate having a single crystal semiconductor layer with favorable characteristics using a separation method with respect to the interface of a first single crystal semiconductor layer and a second single crystal semiconductor formed by a vapor-phase epitaxial growth method, although chemical mechanical polishing (CMP) treatment or heat treatment at a high temperature is not necessarily performed.

In addition to this, although the other technologies to transfer an epitaxy oxide thin film have ever been reported, only a process of manufacturing a thin film as a free-standing membrane by completely separating the thin film from a substrate has been reported. It is problematic in that this thin film membrane transferred to a hetero-substrate (a silicon substrate, a glass substrate, and so on) is very weakly bonded to the substrate due to van der Waals' force, and it is difficult for the thin film membrane to perform a large-scale process.

However, in order to produce a device really, complete bonding between a silicon substrate and a functional oxide thin film should be accomplished.

Thus, the inventors of the present invention made efforts to solve the existing problems, and as a result, have accomplished the present invention devised from the result, which shows that it is possible to grow an epitaxial thin film of very high quality when growing a functional oxide having a similar crystal structure and physical property on an oxide single crystal substrate, by providing a semiconductor substrate with oxide single crystal heterostructures to which an epitaxy oxide thin film layer is bonded via a metal layer in such a manner as to form a metal layer after growing a sacrificial layer, and an epitaxy oxide thin film having a perovskite structure on an oxide single substrate through vacuum deposition, prepare another metal layer on a semiconductor substrate, bond the metal layer of the oxide single crystal substrate to the metal layer of the semiconductor substrate to be face each other, and perform separation of the oxide single crystal substrate by selectively etching and removing only the sacrificial layer after the bonding.

PRIOR ART DOCUMENT

Patent Document (Patent Document 0001) Korean Patent No. 1582247 (Dec. 28, 2015)

Non-Patent Document (Non-Patent Document 0001) Japanese Journal of Applied Physics 2004, 43, 1532-1535.

SUMMARY OF THE INVENTION

An object of the present invention is to provide a semiconductor substrate with oxide single crystal heterostructures to which an epitaxy oxide thin film layer is bonded using a metal layer formed on a semiconductor substrate.

Another object of the present invention is to provide a method of manufacturing a semiconductor substrate with oxide single crystal heterostructures.

The other object of the present invention is to provide an electronic device that comprises a semiconductor substrate with oxide single crystal heterostructures and is applicable to a sensor, an actuator, a microelectromechanical system (MEMS), and so on.

The present invention may provide a semiconductor substrate with oxide single crystal heterostructures according to a first embodiment comprising a metal layer formed on a semiconductor substrate, and an epitaxy oxide thin film having a perovskite structure bonded to the semiconductor substrate via the metal layer.

With respect to the semiconductor substrate with oxide single crystal heterostructures, the metal layer may have a single layer structure or a laminated structure composed of one element, or two or more elements selected from a group consisting of Au, Al, W, Ti, Cr, Pt, Cu, Ni, Mo, Ta, Nb and La.

The laminated structure may be a structure (layer A/layer B/layer A') which shows that layer A, layer B, and layer A' are laminated in order, and the layer A and the layer A' may be identical to or different from each other and may be composed of any one selected from a group consisting of Ti, Cr, Cu, Ni, Pt, and Cr, and the layer B may be composed of any one selected from a group consisting of Au, Mo, Ta, Nb, La, W and CuW.

Furthermore, when the metal layer has a laminated structure (layer A/layer B/layer A') which shows that layer A, layer B, and layer A' are laminated in order, the layer A and the layer A' may be metal adhesion layers having a thickness of 5 to 20 nm, and the layer B may be a metal bonding layer having a thickness of 20 nm to 1 μm.

It may be preferable that a total thickness of the metal is 5 to 1500 nm.

With respect to the semiconductor substrate with oxide single crystal heterostructures, the epitaxy oxide thin film layer may be formed of a functional single crystal oxide of high-quality having crystallinity, a full width at half maximum (FWHM) of which is 0.1° or below, resulting from measurement of an omega rocking curve aimed at a peak at which diffraction peak intensity is most high, in case that the functional single crystal oxide is measured in θ-2θ mode of an X-ray diffractometer.

Furthermore, the epitaxy oxide thin film layer may be composed of a perovskite piezoelectric oxide whose lattice constant is 0.3 nm to 0.45 nm, and the perovskite piezoelectric oxide may comprise any one selected from a group consisting of $Pb(Mg_{1/3},Nb_{2/3})O_3$, $PbZrO_3$, $PbTiO_3$, $SrTiO_3$, $SrRuO_3$, $BaTiO_3$, and $BiFeO_3$, or a solid solution thereof, or a material to which a dopant is added.

More preferably, the perovskite piezoelectric oxide may be composed of a piezoelectric single crystal having a perovskite type crystal structure ($ABO_3$) with a compositional formula of Chemical Formula 1 below:

$$[A1_{-(a+1.5b)}B_aC_b][(MN)_{1-x-y}(L)_yTi_x]O_3 \qquad \text{Chemical Formula 1}$$

In the formula, A represents Pb or Ba,

B represents at least one or more elements selected from a group consisting of Ba, Ca, Co, Fe, Ni, Sn and Sr, C represents at least one or more elements selected from a group consisting of Co, Fe, Bi, La, Ce, Pr, Nd, Pm, Sm, Eu, Gd, Tb, Dy, Ho, Er, Tm, Yb and Lu.

L represents a single form composed of one element selected from Zr or Hf, or a mixed form thereof, M represents at least one or more elements selected from a group consisting of Ce, Co, Fe, In, Mg, Mn, Ni, Sc, Yb, and Zn, N represents at least one or more elements selected from a group consisting of Nb, Sb, Ta and W, and a, b, x, and y satisfy requisites of $0<a≤0.10$, $0<b≤0.05$, $0.05≤x≤0.58$, and $0.05≤y≤0.62$.

In the formula, it may be more preferable that in said formula the piezoelectric single crystal satisfies the requisites of $0.01≤a≤0.10$ and $0.01≤b≤0.05$.

With respect to the semiconductor substrate with oxide single crystal heterostructures according to the present invention, the epitaxy oxide thin film layer may be composed of a perovskite piezoelectric oxide containing Zr grown by a solid-state single crystal growth method and may be a thin film layer without a pore using the same. At this time, a thin film of the epitaxy oxide thin film layer may be formed to have a thickness of 10 μm or more.

Furthermore, the present invention may provide a semiconductor substrate with oxide single crystal heterostructures according to a second embodiment that comprises a structure which shows that the epitaxy oxide thin film layer is patterned into a plurality of lattice cells.

With respect to a method of manufacturing a semiconductor substrate with oxide single crystal heterostructures 1 according to the first embodiment, the present invention may provide the method of manufacturing the semiconductor substrate with oxide single crystal heterostructures, comprising: preparing a semiconductor substrate 10 and an oxide single crystal substrate 50; successively forming a sacrificial layer 40, an epitaxy oxide thin film layer 30, and a metal layer 20A to be piled up from the oxide single crystal substrate 50; forming a metal layer 20B on the semiconductor substrate 10; bonding the metal layer 20A of the oxide single crystal substrate to the metal layer 20B of the semiconductor substrate to be face to each other; and performing separation of the oxide single crystal substrate 50 by etching and removing the sacrificial layer 40 after the bonding.

Furthermore, with respect to a method of manufacturing a semiconductor substrate with oxide single crystal heterostructures 2 according to the second embodiment, the present invention may provide the method of manufacturing the semiconductor substrate with oxide single crystal heterostructures, comprising: preparing a semiconductor substrate 11 and an oxide single crystal substrate 50; successively forming a sacrificial layer 40, an epitaxy oxide thin film layer 31, and a metal layer 21A to be piled up from the oxide single crystal substrate 50; patterning the epitaxy oxide-thin film layer 31 and the metal layer 21A into a plurality of lattice cells; forming a metal layer 21B on the semiconductor substrate 11; bonding the metal layer 21A of the oxide single crystal substrate to the metal layer 21B of the semiconductor substrate to be face to each other; and performing separation of the oxide single crystal substrate 50 by etching and removing the sacrificial layer 40 after the bonding.

With respect to the method of manufacturing the semiconductor substrate with oxide single crystal heterostructures according to the first embodiment or the second embodiment, the semiconductor substrate may be any one selected from a silicon substrate, a silicon-on-insulator, a sapphire substrate, GaAs wafer, AlN wafer, Ge wafer, SiGe wafer, GaN wafer, AlGaN wafer, SiC wafer, AlSiC wafer, or Ni plate, Cu plate, Nb plate, Mo plate, Ta plate, La plate, CuW plate, NiW plate, NiCu plate, or a laminated structure composed of the plate materials.

Furthermore, the oxide single crystal substrate may be composed of any one selected from a group consisting of $SrTiO_3$, $DyScO_3$, $GdScO_3$, $TbScO_3$, $EuScO_3$, $SmScO_3$, $NdScO_3$, $PrScO_3$, $CeScO_3$, $LaScO_3$, $LaLuO_3$, $NdGaO_3$, $LaGaO_3$, $SrLaGaO_4$, and $LaAlO_3$.

The oxide single crystal substrate may be subjected to surface treatment to have a surface roughness of 1 nm or below.

With respect to the method of manufacturing the semiconductor substrate with oxide single crystal heterostructures according to the first embodiment or the second embodiment, the metal layer may be formed in a single layer structure or a laminated structure composed of one element, or two or more elements selected from a group consisting of Au, Al, W, Ti, Cr, Pt, Cu, Ni, Mo, Ta, Nb and La, and the laminated structure may be a structure (layer A/layer B/layer A') which shows that layer A, layer B and layer A' are laminated in order, wherein the layer A and the layer A' may be identical to or different from each other and may be composed of any one selected from a group consisting of Ti, Cr, Cu, Ni, Pt and Cr, and the layer B may be composed of any one selected from a group consisting of Au, Mo, Ta, Nb, La, W and CuW.

At this time, in the laminated structure (layer A/layer B/layer A') which shows that the layer A, the layer B, and the layer A' are laminated in order, the layer A and the layer A' may be formed with metal adhesion layers having a thickness of 5 to 20 nm, and the layer B may be formed with a metal bonding layer having a thickness of 20 nm to 1 μm.

With respect to the method of manufacturing the semiconductor substrate with oxide single crystal heterostructures according to the present invention, the bonding may be performed in such a manner as to array the metal layers of each substrate at the same position to be face to each other, mechanically bond them to each other, and then applying pressure and heat thereto.

Moreover, the present invention may provide an electronic device comprising a semiconductor substrate with oxide single crystal heterostructures that is configured in such a manner that an epitaxy oxide thin film is bonded to a semiconductor substrate via a metal layer.

The electronic device may be applied to general an electric and electronic device, and an optical device, and in particular, thanks to a high quality of the piezoelectric single crystal, may also be applied to any one device selected from a group consisting of a sensor, an actuator, a transducer, and a microelectromechanical system (MEMS).

The present invention can provide a semiconductor substrate with oxide single crystal heterostructures and a method thereof, to which a high-quality epitaxial functional oxide thin film layer is bonded using a metal layer formed on a semiconductor substrate, and more specifically, to which a sacrificial layer, a high-quality epitaxy functional oxide thin film and a metal layer are grown on an oxide single crystal substrate, prepared another metal layer on a semiconductor substrate, and bonded the metal layer of the oxide single crystal substrate to the metal layer of the semiconductor substrate to be face each other, and then separated the oxide single crystal substrate by selectively etching and removing only the sacrificial layer after the bonding.

The semiconductor substrate with oxide single crystal heterostructures obtained from each of the manufacturing methods according to the present invention is a semiconductor substrate to which the epitaxy oxide thin film layer is bonded via the metal layer, and since complete bonding between the semiconductor substrate and the epitaxy oxide thin film layer is realized, it is possible to perform a process of a large area.

Furthermore, the epitaxy oxide thin film facilitates crystal orientation and domain structure control due to interaction with the semiconductor substrate, and in particular, includes a piezoelectric single crystal of a perovskite crystal structure ($ABO_3$), electrical and electronic devices, and optical devices. In addition, sensors, actuators, transducers, or MEMS devices can be manufactured.

DETAILED DESCRIPTION OF THE INVENTION

Hereinafter, the present invention will be described in detail.

The present invention provides a semiconductor substrate with oxide single crystal heterostructures to which a high-quality epitaxy functional oxide thin film is bonded using a metal layer formed on a semiconductor substrate.

Figures 1, 2:
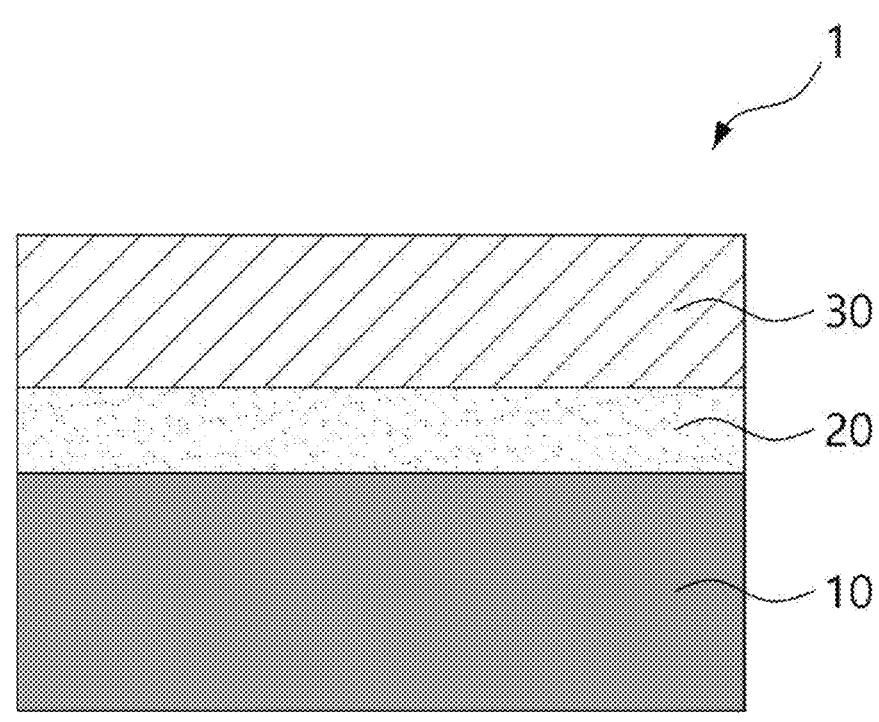
FIG. 1 is a cross-sectional view showing a semiconductor substrate with oxide single crystal heterostructures according to a first embodiment of the present invention.
FIG. 2 is an SEM (Scanning Electron Microscope) image concerning a section of the semiconductor substrate with oxide single crystal heterostructures (PMN-PZT/Ti/Au/Ti/Si) shown in FIG. 1.

FIG. 1 is a cross-sectional view of a semiconductor substrate with oxide single crystal heterostructures according to a first embodiment of the present invention, providing a semiconductor substrate with oxide single crystal heterostructures 1 comprising: a metal layer 20 formed on a semiconductor substrate 10, and an epitaxy oxide thin film layer 30 having a perovskite structure bonded to the semiconductor via the metal layer 20.

With respect to the semiconductor substrate with oxide single crystal heterostructures, if a substrate has electrically or thermally excellent conductivity, it may be used as the semiconductor substrate 10, and preferably, any one selected from a silicon substrate, a silicon-on-insulator, a sapphire substrate, GaAs wafer, AlN wafer, Ge wafer, SiGe wafer, GaN wafer, AlGaN wafer, SiC wafer, AlSiC wafer, or Ni plate, Cu plate, Nb plate, Mo plate, Ta plate, La plate, CuW plate, NiW plate, NiCu plate, or a laminated structure composed of the plate materials is used. At this time, in case that the semiconductor substrate 10 is a silicon substrate or a silicon-on-insulator, a silicon oxidizing film or a hetero-oxide layer may be provided on the silicon substrate, and the metal layer is formed at an upper part of a second layer.

With respect to the semiconductor substrate with oxide single crystal heterostructures according to the present invention, the metal layer 20 may be a single layer structure or a laminated structure composed of one element, or two or more elements selected from a group consisting of Au, Al, W, Ti, Cr, Pt, Cu, Ni, Mo, Ta, Nb and La.

More preferably, the laminated structure is a structure in which an A layer, a B layer and an A' layer are laminated in order, the A layer and the A' layer are able to be identical to or different from each other and are any one selected from a group consisting of Ti, Cr, Cu, Ni, Pt and Cr, and the B layer is any one selected from a group consisting of Au, Mo, Ta, Nb, La, W and CuW.

Furthermore, when the metal layer 20 according to the present invention is the laminated structure (layer A/layer B/layer A') which shows that the A layer, the B layer, and the A' layer are laminated in order, it is a structure that the A layer and the A' layer are formed with metal adhesion layers having a thickness of 5 to 20 nm, and the B layer is formed with a metal bonding layer having a thickness of 20 nm to 1 μm, examples of a bonding structure of the metal layer which is bonded after transferring are Ti/Au/Ti, Cu/Mo/Cu, Ni/Mo/Ni, Cu/Ta/Cu, Ni/Ta/Ni, Cu/Nb/Cu, Ni/Nb/Ni, Cu/La/Cu, Ni/La/Ni, Cu/W/Cu, Ni/W/Ni, Cu/CuW/Cu, Ni/CuW/Ni, Pt/Au/Pt, Cr/Au/Cr, Ti/Au/Pt, and so on, and are not limited to these laminated structures but are able to include a combination thereof, and a symmetrical or asymmetrical structure may also be included upon laminating.

It is preferable to form a total thickness of the metal layer after transferring in a range of 5 to 1500 nm. At this time, if the metal layer has a very thin thickness of less than 5 nm, it may not be deposited on a whole surface according to surface roughness of the substrate or the epitaxy oxide thin film layer to be transferred, and if the thickness exceeds 1500 μm, it may be problematic in that as the thickness becomes thicker, prices rise because precious metals such as Au and so on are used, and it is not necessary to form the thickness to be excessively thick because the thickness should be set up in such a standard that the metal layer can be used as a lower electrode.

Accordingly, in the semiconductor substrate with oxide single crystal heterostructures according to the present invention, the metal layer 20 may be used as the lower electrode.

Furthermore, in the semiconductor substrate with oxide single crystal heterostructures according to the present invention, the epitaxy oxide thin film layer 30 is formed of a functional single crystal oxide of high-quality having crystallinity, a full width at half maximum (FWHM) of which is 0.1° or below, resulting from measurement of an omega rocking curve aimed at a peak at which diffraction peak intensity is most high, in case that functional single crystal oxide is measured in θ-2θ mode of an X-ray diffractometer.

Specifically, the single crystal oxide is a perovskite piezoelectric oxide whose lattice constant is 0.3 nm to 0.45 nm, and specifically, the perovskite piezoelectric oxide comprises any one selected from a group consisting of $Pb(Mg_{1/3}Nb_{2/3})O_3$, $PbZrO_3$, $PbTiO_3$, $SrTiO_3$, $SrRuO_3$, $BaTiO_3$, and $BiFeO_3$, or a solid solution thereof, or a material to which a dopant is added.

Detailed examples are PMN-PT ($Pb(Mg_{1/3}Nb_{2/3})O_3$—$PbTiO_3$) and PMN-PZT ($Pb(Mg_{1/3}Nb_{2/3})O_3$—$Pb(Zr,Ti)O_3$), and in particular, in an exemplary embodiment of the present invention, even though PMN-PZT ($Pb(Mg_{1/3}Nb_{2/3})O_3$—$Pb(Zr,Ti)O_3$) is used and described, the epitaxy functional oxide thin film 30 of high quality may be formed using a piezoelectric single crystal having a perovskite type crystal structure $ABO_3$ based on a result which shows that a PMN-PZT thin film, which is the epitaxy oxide thin film layer 30, is smoothly bonded to the semiconductor substrate via the metal layer.

A perovskite piezoelectric oxide ($[A][(MN)_{1-x-y}Ti_xZr_y]O_3$) including Zr grown by a solid-state single crystal growth method may be used as the piezoelectric single crystal of the perovskite type crystal structure (well-known through Korean Patent No. 0743614).

In said formula, A represents at least one or more elements selected from a group consisting of Pb, Sr, Ba, and Bi, M represents at least one or more element selected from a group consisting of Ce, Co, Fe, In, Mg, Mn, Ni, Sc, Yb, and Zn, N represents at least one or more element selected from a group consisting of Nb, Sb, Ta, and W, and x and y satisfy the following requisites: $0.05 \leq x \leq 0.58$ (mole fraction), and $0.05 \leq y \leq 0.62$ (mole fraction).

Furthermore, according to the semiconductor substrate with oxide single crystal heterostructures of the present invention, in order to provide the epitaxy oxide thin film layer 30 of high quality, the epitaxy oxide thin film layer 30 is formed of a piezoelectric single crystal of a perovskite type crystal structure (ABO$_3$) having a compositional formula of Chemical Formula 1 below.

$$[A1_{-(a+1.5b)}B_aC_b][(MN)_{1-x-y}(L)_yTi_x]O_3 \quad \text{Chemical Formula 1}$$

In said formula, A represents Pb or Ba,

B represent at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu, L represents a single form composed of any one selected from Zr or Hf, or a mixed form thereof, M represents at least one or more element selected from a group consisting of Ce, Co, Fe, In, Mg, Mn, Ni, Sc, Yb and Zn, and N represents at least one or more elements selected from a group consisting of Nb, Sb, Ta and W, and a, b, x and y satisfy requisites of 0<a≤0.10, 0<b≤0.05, 0.05≤x≤0.58, and 0.05≤y≤0.62.

Preferably, in the formula, a piezoelectric single crystal satisfies the requisites of 0.01≤a≤0.10 and 0.01≤b≤0.05, and more preferably, satisfying a requisite of a/b≥2. At this time, in the requisites, when a is less than 0.01, it is problematic in that a perovskite phase is unstable, and when a exceeds 0.10, it is not preferable in that it is difficult to use the piezoelectric single crystal really because a phase transition temperature becomes too low.

Also, if the requisite of a/b≥2 is not satisfied, it will not be preferable because it is problematic in that dielectric and piezoelectric characteristics are not maximized, or growth of the single crystal is limited.

With respect to the piezoelectric single crystal of the perovskite type crystal structure ABO$_3$ having the compositional formula of the chemical formula 1, based on a tendency which shows that as chemical composition becomes complex, the more the piezoelectric characteristic increases, in the perovskite type crystal structure (ABO$_3$), the ions located at the [A] are constituted of mixed composition of [A$_{1-(a+1.5b)}$B$_a$C$_b$]. The composition of A includes a flexible or inflexible element, and according to the exemplary embodiment of the present invention, even though it is described under the condition that the composition is limited to flexible piezoelectric single crystal which shows that A is Pb, the composition is not be limited thereto.

In the composite composition of the [A] site ion in the piezoelectric single crystal having the compositional formula of Chemical Formula 1, it is possible to implement an excellent dielectric constant when the composite composition is compared to the case where the metal trivalent element or the metal divalent element is alone.

The piezoelectric single crystal having the compositional formula of Chemical Formula 1 includes a metal tetravalent element as an ion located at [B] in the perovskite type crystal structure ABO$_3$, and in particular, composition of L is limited to a single form composed of one element selected from Zr or Hf, or a mixed form thereof.

Accordingly, according to the present invention, although the composition is complicated chemical composition using a solid-state single crystal growth method, the piezoelectric single crystal of uniform composition is used irrespective of the composition, and based on the mixed composition of the ions located at [A], the epitaxy oxide thin film layer is formed of a piezoelectric single crystal with dielectric characteristics, such as a high dielectric constant K$_{3T}$, high piezoelectric constants d$_{33}$ and k$_{33}$, high phase transition temperatures T$_C$ and T$_{RT}$, and a high coercive electric field E$_C$.

The epitaxy oxide thin film layer 30 according to the present invention comprises a perovskite piezoelectric oxide containing Zr grown by a solid-state single crystal growth method, and even though the perovskite piezoelectric oxide including a pore occurring in a process of the solid-state single crystal growth method is used, it is characteristic in that the epitaxy oxide thin film layer is formed into a thin film in which no pore exists.

It is preferable that the thin film of the epitaxy oxide thin film layer 30 has a thickness of 10 μm or more. At this time, the more the thickness of the epitaxy oxide thin film layer is thick the better because the thickness is fixed in such a manner as to cut the bulk single crystal in a wafer shape, and polish after bonding it to the semiconductor substrate. Accordingly, within the scope of the manner in progress, it is possible to form all allowable thicknesses in the light of time and economics, preferably, a thickness of 10 μm or more, and more preferably, a thickness of 10 to 50 μm.

FIG. 2 is an SEM (Scanning Electron Microscope) image concerning a cross section of the semiconductor substrate with oxide single crystal heterostructures shown in FIG. 1 and shows that according to the exemplary embodiment of the present invention, a silicon substrate is used as the semiconductor substrate 10, and a bonding structure of the semiconductor substrate with oxide single crystal heterostructures (PMN-PZT/Ti/Au/Ti/Si), which shows that the PMN-PZT layer is bonded to the Si substrate via the metal layer including Ti, Au and Ti layers), comprising the metal layer 20 of a metal bonding layer on a metal adhesion layer, and PMN-PZT single crystal of the epitaxy oxide thin film layer 30 of high quality can be confirmed.

Figure 3:
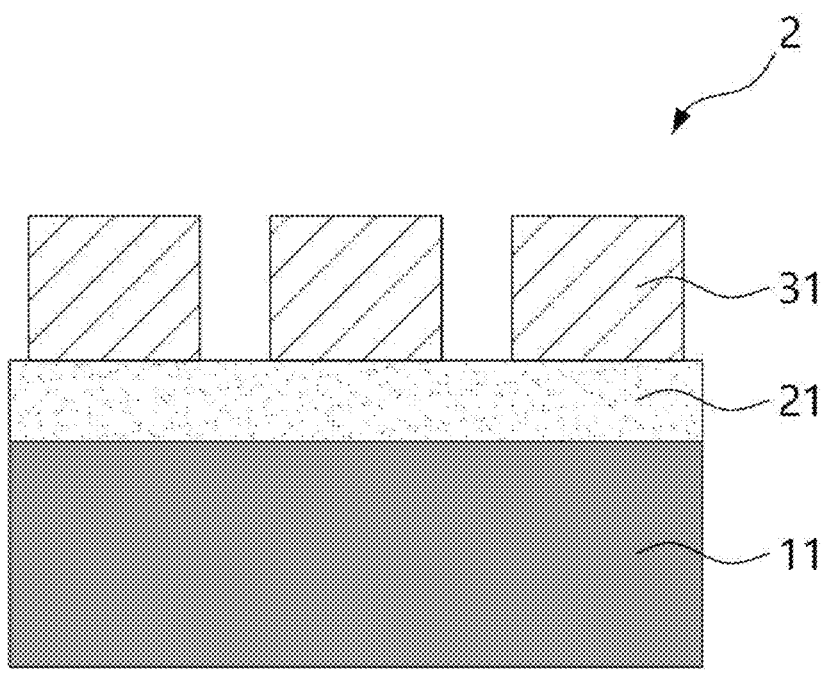
FIG. 3 is a cross-sectional view showing a semiconductor substrate with oxide single crystal heterostructures according to a second embodiment of the present invention.

FIG. 3 is a cross-sectional view of a semiconductor substrate with oxide single crystal heterostructures 2 according to a second embodiment of the present invention, comprising a metal layer 21 formed on a semiconductor substrate 11, an epitaxy oxide thin film layer 31 having a perovskite structure bonded to the metal layer, wherein the epitaxy oxide than film layer 31 is a structure of being patterned into a plurality of lattice cells.

Since raw materials and sizes of the semiconductor substrate, the metal layer, and the epitaxy oxide thin film layer are identical to those of the semiconductor substrate 10, the metal layer 20, and the epitaxy oxide thin film layer 30 as described based on the first embodiment, the detailed description thereof is omitted.

Figure 4:
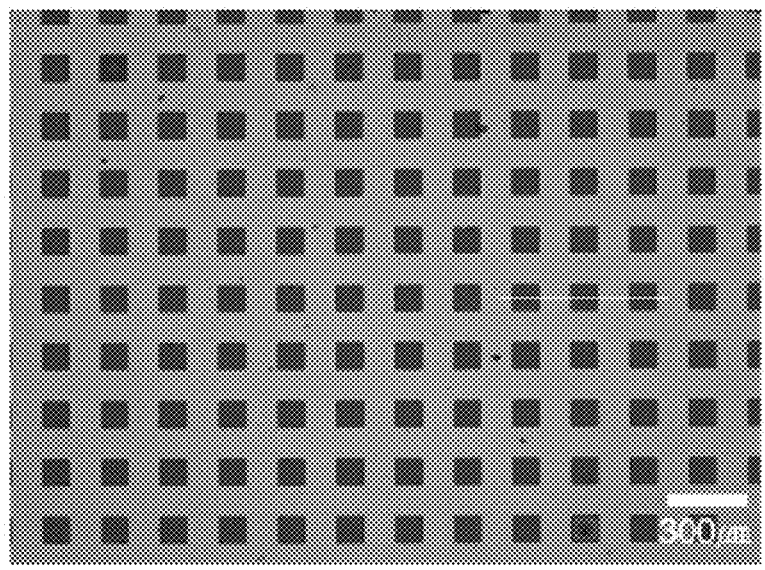
FIG. 4 is an optical image of the semiconductor substrate with oxide single crystal heterostructures (PMN-PZT/Ti/Au/Ti/Si) shown in FIG. 3.
Figure 5:
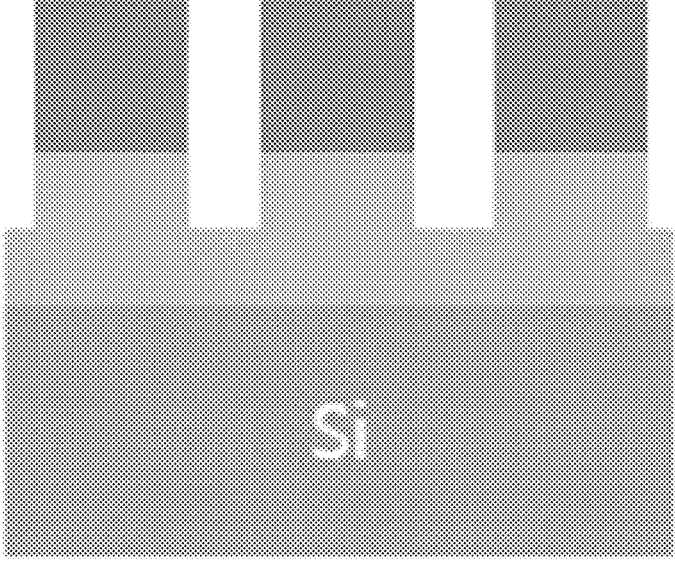
FIG. 5 is a cross-sectional schematic diagram showing cutting portions of three patterns of the semiconductor substrate with oxide single crystal heterostructures shown in FIG. 4.
Figure 6:
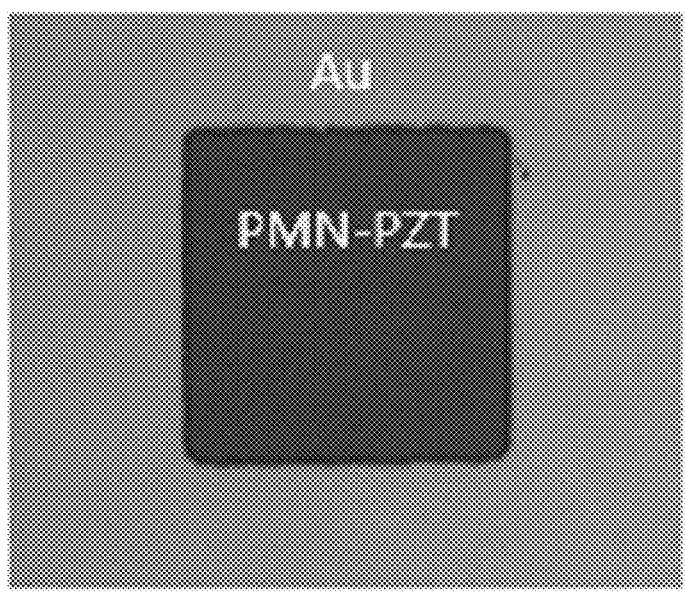
FIG. 6 is a front view showing a pattern unit of the semiconductor substrate with oxide single crystal heterostructures shown in FIG. 4.

FIG. 4 is an optical image showing the semiconductor substrate with oxide single crystal heterostructures (PMN-PZT/Ti/Au/Ti/Si) according to the second embodiment, FIG. 5 is a cross-sectional schematic diagram showing three pattern cutting parts shown in the semiconductor substrate with oxide single crystal heterostructures, FIG. 6 represents a front view showing a pattern unit of the semiconductor substrate with oxide single crystal heterostructures shown in FIG. 4, and as a result, smooth bonding of the metal layer 21 formed on the semiconductor substrate 11, and the epitaxy oxide thin film layer 31 patterned into a plurality of lattice cells on the metal layer can be confirmed.

Figure 7:
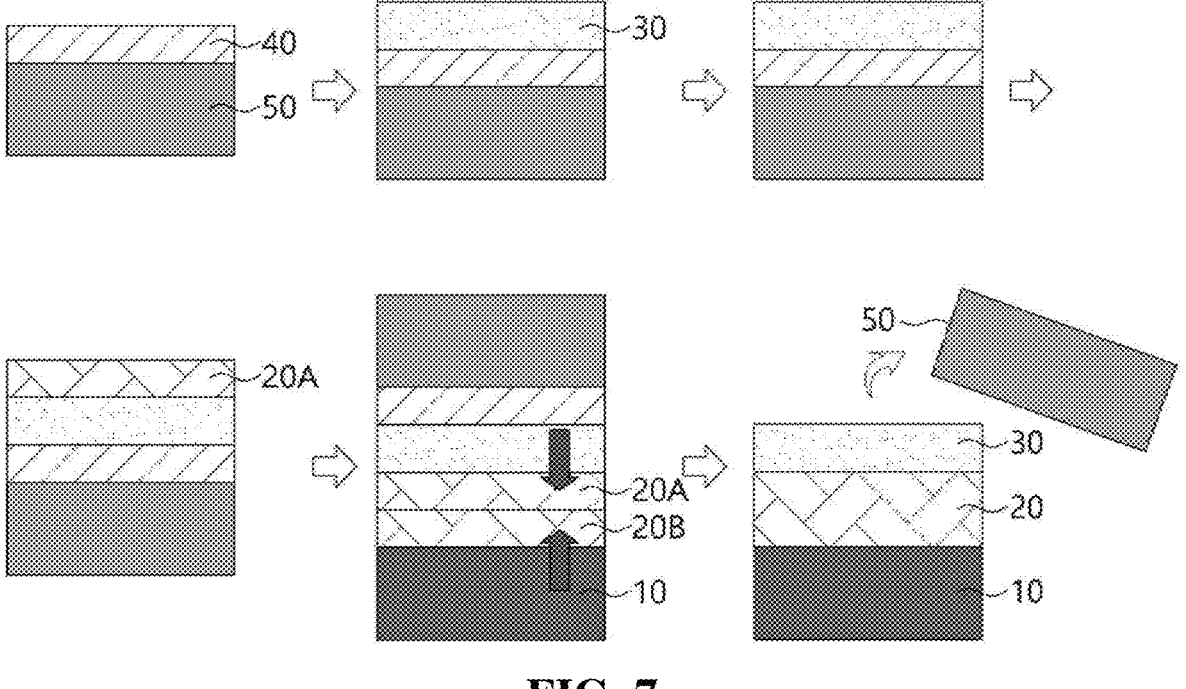
FIG. 7 is a schematic diagram showing a method of manufacturing the semiconductor substrate with oxide single crystal heterostructures according to the first embodiment of the present invention.

FIG. 7 is a schematic diagram showing a method of manufacturing the semiconductor substrate with oxide single crystal heterostructures according to the first embodiment of the present invention, and provides the method of manufacturing the semiconductor substrate with oxide single crystal heterostructures, comprising:

step 1) of preparing a semiconductor substrate 10 and an oxide single crystal substrate 50;

step 2) of successively forming a sacrificial layer 40, an epitaxy oxide thin film layer 30, and a metal layer 20A to be piled up from the oxide single crystal substrate 50;

step 3) of forming a metal layer 20B on the semiconductor substrate 10;

step 4) of bonding the metal layer 20A of the oxide single crystal substrate 50 to the metal layer 20B of the semiconductor substrate 10 to be face to each other; and step 5) of performing separation of the oxide single crystal substrate 50 by etching and removing the sacrificial layer 40 after the bonding.

With respect to the method of manufacturing the semiconductor substrate with oxide single crystal heterostructures according to the first embodiment of the present invention, in said step 1), the semiconductor substrate 10 is any one selected from a silicon substrate, a silicon-on-insulator, a sapphire substrate, GaAs wafer, AlN wafer, Ge wafer, SiGe wafer, GaN wafer, AlGaN wafer, SiC wafer, AlSiC wafer, or Ni plate, Cu plate, Nb plate, Mo plate, Ta plate, La plate, CuW plate, NiW plate, NiCu plate, or a laminated structure composed of the plate materials, and in the exemplary embodiment of the present invention, although the present invention is described based on the case that a silicon substrate is used, an example of the semiconductor substrate is not limited thereto.

Furthermore, the oxide single crystal substrate 50 of said step 1) is formed of a material having a perovskite structure, and as one preferable example, any one selected from a group consisting of $SrTiO_3$, $DyScO_3$, $GdScO_3$, $TbScO_3$, $EuScO_3$, $SmScO_3$, $NdScO_3$, $PrScO_3$, $CeScO_3$, $LaScO_3$, $LaLuO_3$, $NdGaO_3$, $LaGaO_3$, $SrLaGaO_4$, and $LaAlO_3$ can be used. At this time, the oxide single crystal substrate 50 is prepared by being subjected to surface treatment to have a surface roughness of 1 nm or below using chemical etching and thermal treatment so that it is favorable to form an epitaxy film at an upper part.

With respect to the method of manufacturing the semiconductor substrate with oxide single crystal heterostructures according to the first embodiment of the present invention, in said step 2), when a functional oxide having a similar crystal structure and physical property grows on the oxide single crystal substrate 50, it is possible to realize the growth of an epitaxy thin film of very high quality. This epitaxy thin film facilitates crystal alignment and domain structure control due to interaction with the substrate, and it is possible to perform evaporation so as to have more improved crystallinity than that of a bulk single crystal.

Thus, the epitaxy sacrificial layer 40 may be formed on the oxide single crystal substrate 10 using a vacuum deposition process, and the functional epitaxy oxide thin film layer 30 to be transferred may be formed on the epitaxy sacrificial layer 40. At this time, the epitaxy sacrificial layer 40 and the epitaxy oxide thin film layer 30 are formed using a process, such as sputtering, pulsed laser deposition (PLD), molecular beam epitaxy (MBE), chemical vapor deposition (CVD), an evaporator, and so on.

At this time, it is characteristic in that the epitaxy oxide thin film layer 30 to be transferred onto a silicon substrate has crystallinity, a full width at half maximum (FWHM) of which is 0.1° or below, resulting from measurement of an omega rocking curve aimed at a peak at which diffraction peak intensity is most high, in case that the epitaxy oxide thin film layer is measured in θ-2θ mode of an X-ray diffractometer (for example, in the case of an orientation of (001) plane, a diffraction peak of (002) plane).

After the epitaxy oxide thin film layer 30 has been formed, chemical mechanical polishing (CMP) treatment may be further carried out for surface polishing.

After the treatment, the metal layer 20A may be formed on the epitaxy oxide thin film layer 30 using a process, such as sputtering, an evaporator, atomic layer deposition (ALD), chemical vapor deposition (CVD), and so on.

Specifically, the metal layer 20A may be a single layer structure or a laminated structure composed of one element, or two or more elements selected from a group consisting of Au, Al, W, Ti, Cr, Pt, Cu, Ni, Mo, Ta, Nb, and La.

The laminated structure is a structure (layer A/layer B/layer A') which shows that layer A, layer B, and layer A' are laminated in order, the layer A and the layer A' may be identical to or different from each other and may be formed of any one selected from a group consisting of Ti, Cr, Cu, Ni, Pt, and Cr, and the layer B may be formed of any one selected from a group consisting of Au, Mo, Ta, Nb, La, W and CuW.

More particularly, the metal layer 20A is composed of a metal bonding layer which is configured in such a manner that any one selected from a group consisting of Au, Mo, Ta, Nb, La, W, and CuW is deposited on a metal adhesion layer formed of any one selected from a group consisting of Ti, Cr, Cu, Ni, Pt, and Cr.

With respect to the method of manufacturing the semiconductor substrate with oxide single crystal heterostructures according to the first embodiment of the present invention, said step 3) is a step of forming the metal layer 20B on the semiconductor substrate 10.

At this time, using a similar manner to that of forming the metal layer in said step 2), the metal layer 20B is formed into a metal bonding layer which is configured in such a manner that any one selected from a group consisting of Au, Mo, Ta, Nb, La, W, and CuW is deposited on a metal adhesion layer formed of any one selected from a group consisting of Ti, Cr, Cu, Ni, Pt, and Cr.

In order to remove oxide layers or other contaminants which can be formed on each surface of the metal layers after evaporation, modifying each surface of the metal layers 20A and 20B may be further performed using Ar or $O_2$ plasma.

After this, said step 4) of the method of manufacturing the semiconductor substrate with oxide single crystal heterostructures according to the first embodiment of the present invention is to perform a step of bonding the metal layer 20A of the oxide single crystal substrate to the metal layer 20B of the semiconductor substrate to be face to each other.

Specifically, the metal layers 20A, and 20B are bonded to each other by a pressurization and heating means after being mechanically bonded by being aligned at the same position to be opposite each other, namely, to face each other.

The bonding means may apply a pressure of 0.1 to 10 MPa for 10 to 20 seconds and heat having a temperature of 400° C. or below to the metal layers, and the heat may be adopted selectively. In order to increase efficiency of the bonding, if necessary, a process of removing impurities through Ar or $O_2$ plasma treatment intended for each of the metal bonding layers and activating each surface may be performed.

At this time, a bonding structure of the metal layer 20 bonded after transferring may be formed of any one selected from a group consisting of Ti/Au/Ti, Cu/Mo/Cu, Ni/Mo/Ni, Cu/Ta/Cu, Ni/Ta/Ni, Cu/Nb/Cu, Ni/Nb/Ni, Cu/La/Cu, Ni/La/Ni, Cu/W/Cu, Ni/W/Ni, Cu/CuW/Cu, Ni/CuW/Ni, Pt/Au/Pt, Cr/Au/Cr, and Ti/Au/Pt. These laminated structures are only described as preferable examples without being limited thereto, may be combined with each other and may also include a symmetrical structure or an asymmetrical structure.

Furthermore, when the metal layer 20 bonded after transferring according to the present invention has a laminated structure (layer A/layer B/layer A') which shows that layer A, layer B, and layer A' are laminated in order, the layer A and the layer A' are formed with metal adhesion layers having a thickness of 5 to 20 nm, and the layer B is formed with a metal bonding layer having a thickness of 20 nm to 1 μm.

It is preferable that a total thickness of the metal layer 20 after transferring is formed in a range of 5 to 1500 nm.

Said step 5) of the method of manufacturing the semiconductor substrate with oxide single crystal heterostructures according to the first embodiment of the present invention is to produce the semiconductor substrate 10 to which the epitaxy oxide thin layer 30 is bonded via the metal layer 20 in such a manner as to put the bonded two substrates into an etching liquid and perform separation of the oxide single crystal substrate 50 by selectively etching and removing only the sacrificial layer 40.

At this time, the metal layer 20 may be used as a lower electrode according to a device, and the oxide single crystal substrate 50 which has been separated may be reused.

Figure 8:
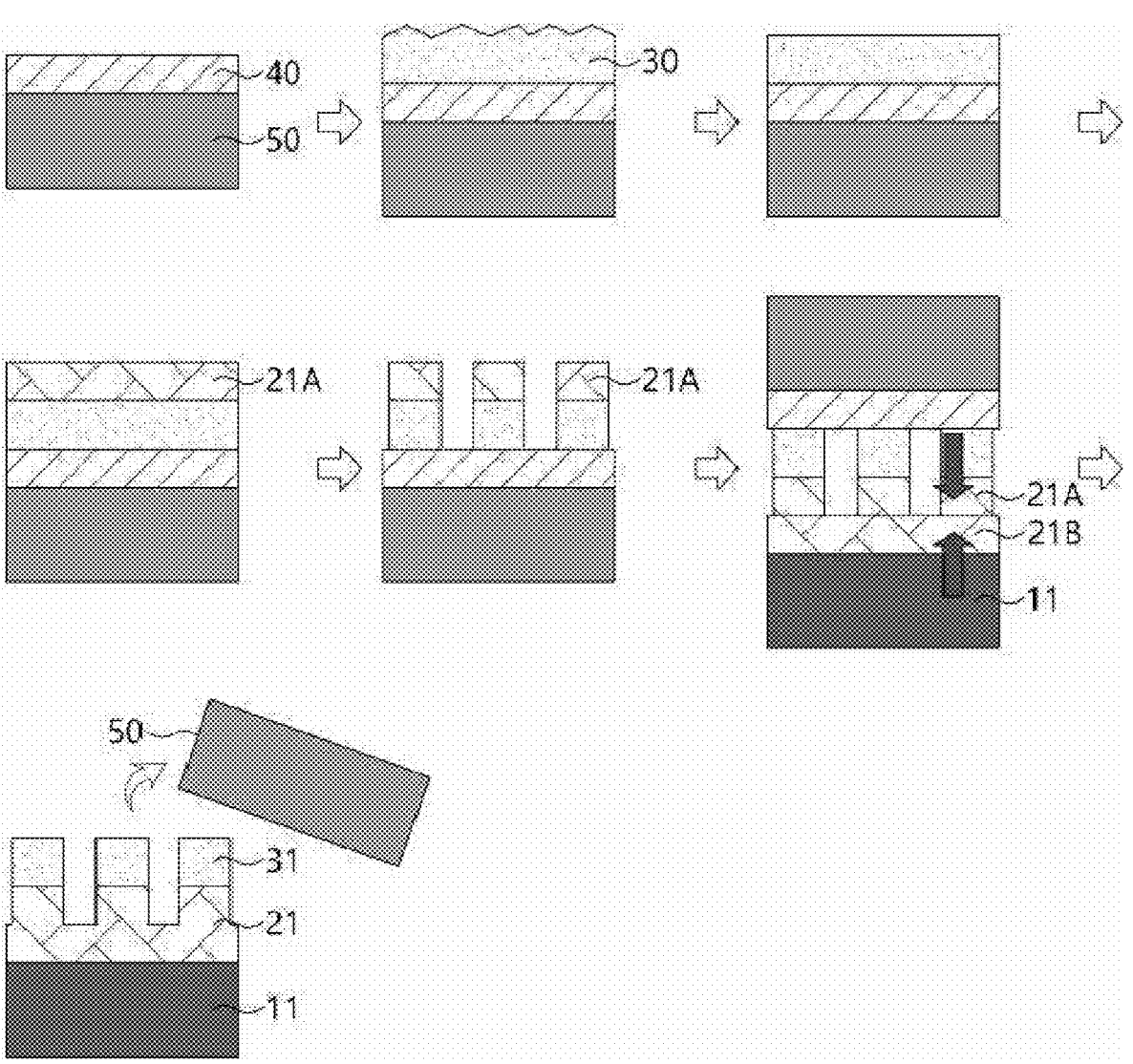
FIG. 8 is a schematic diagram showing a method of manufacturing the semiconductor substrate with oxide single crystal heterostructures according to the second embodiment of the present invention.

FIG. 8 is a schematic diagram showing a method of manufacturing the semiconductor substrate with oxide single crystal heterostructures according to the second embodiment of the present invention, providing the method of manufacturing the semiconductor substrate with oxide single crystal heterostructures, comprising:

step 1) of preparing a semiconductor substrate 11 and the oxide single crystal substrate 50;
    step 2) of successively forming a sacrificial layer 40, an epitaxy oxide thin film layer 31, and a metal layer 21A to be piled up from the oxide single crystal substrate 50;
    step 3) of patterning the epitaxy oxide thin film layer 31 and the metal layer 21A into a plurality of lattice cells;
    step 4) of forming a metal layer 21B on the semiconductor substrate 11;
    step 5) of bonding the metal layer 21A of the oxide single crystal substrate to the metal layer 21B of the semiconductor substrate to be face to each other; and
    step 6) of performing separation of the oxide single crystal substrate 50 by etching and removing the sacrificial layer 40 after the bonding.

The manufacturing method of the semiconductor substrate with oxide single crystal heterostructures according to the second embodiment of the present invention is identical to that of the semiconductor substrate with oxide single crystal heterostructures according to the first embodiment except the step of patterning the epitaxy oxide thin film layer 31 and the metal layer 21A formed to be piled up from the oxide single crystal substrate 50 into a plurality of lattice cells.

At this time, with respect to the manufacturing method of the semiconductor substrate with oxide single crystal heterostructures according to the second embodiment, in the epitaxy oxide thin film layer 31, a functional epitaxy thin film may be produced in a shape like islands separated from each other at a fixed interval using a wet etching method or a dry etching method, and this structure may be used for the purpose of isolation to improve an etching speed of the sacrificial layer in the future or to control each mechanical and electrical reciprocal interference among cells.

Figure 9:
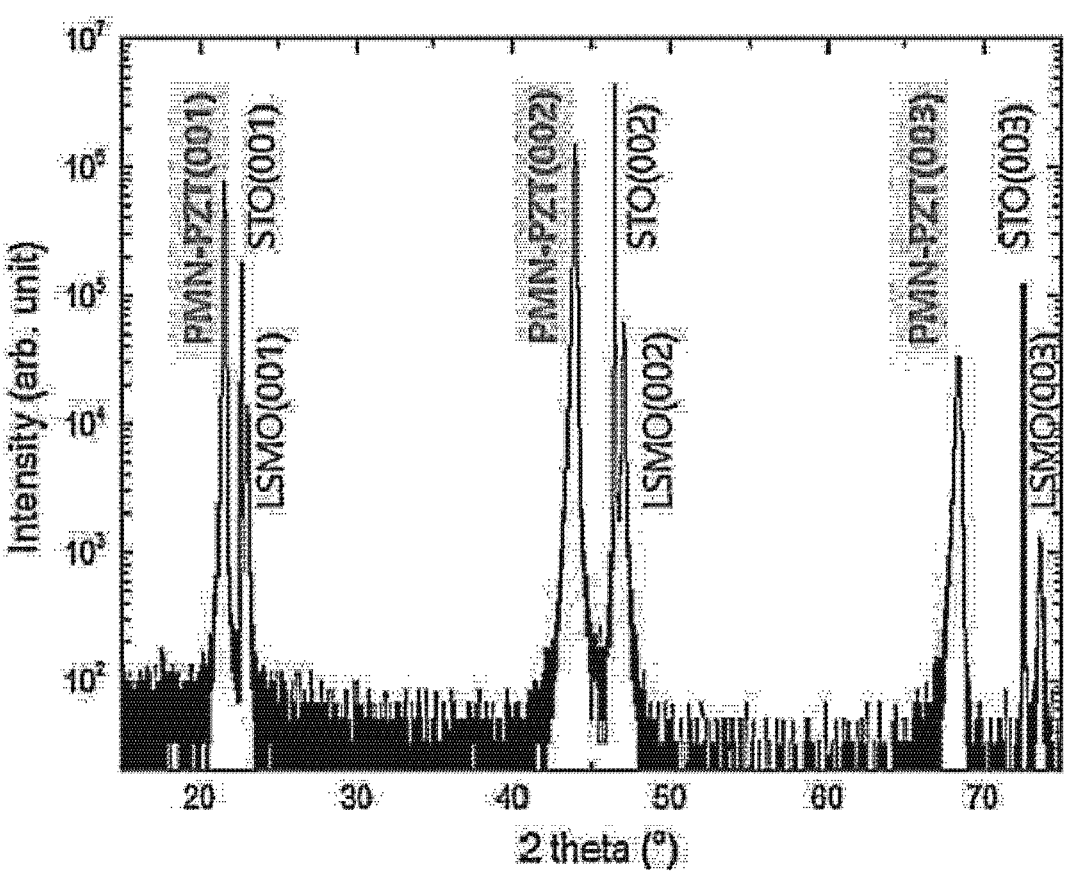
FIG. 9 is a graph concerning the analysis of X-ray diffraction before transferring according to the semiconductor substrate with oxide single crystal heterostructures of to the present invention.
Figure 10:
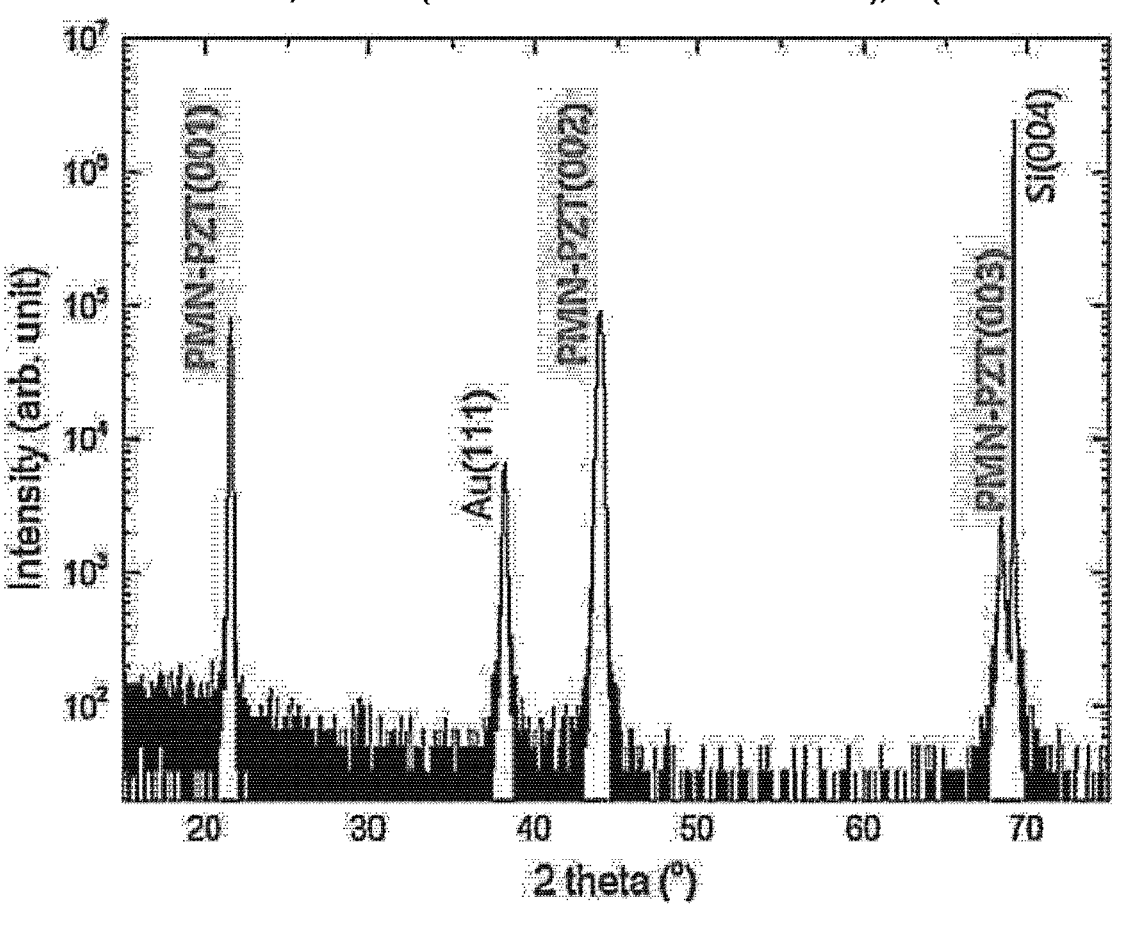
FIG. 10 is a graph concerning the analysis of X-ray diffraction after transferring according to the semiconductor substrate with oxide single crystal heterostructures of the present invention.

FIG. 9 and FIG. 10 show graphs concerning each analysis of X-ray diffraction before and after transferring of the bonding substrate with respect to the manufacturing method of the semiconductor substrate with oxide single crystal heterostructures according to the second embodiment of the present invention, and as each peak corresponding to the structure before transferring of the bonding substrate (PMN-PZT/LSMO (sacrificial layer)/STO (oxide single crystal substrate)), and the structure after transferring of the bonding substrate (PMN-PZT/Au&Ti (metal layer)/Si (semiconductor substrate)), is confirmed, manufacturing of the semiconductor substrate 11 to which the epitaxy oxide thin film layer 31 is bonded via the metal layer 21 may be confirmed.

Figure 11:
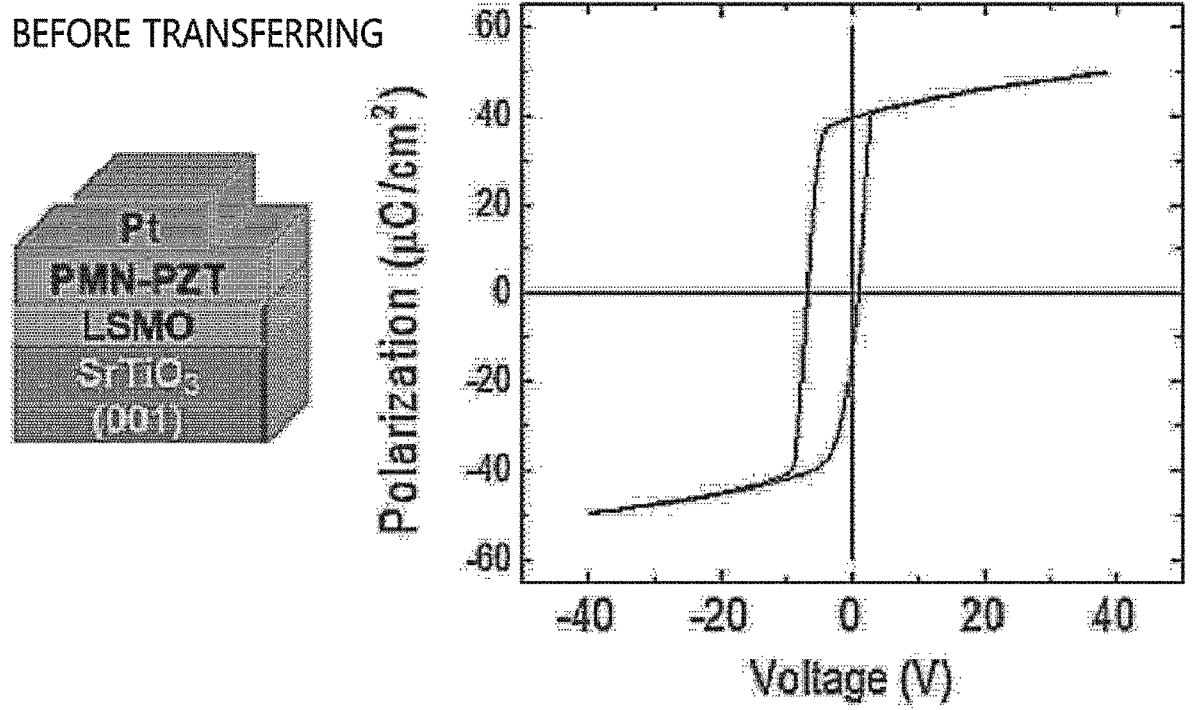
FIG. 11 is a graph concerning polarization versus voltage before transferring according to the semiconductor substrate with oxide single crystal heterostructures of the present invention.
Figure 12:
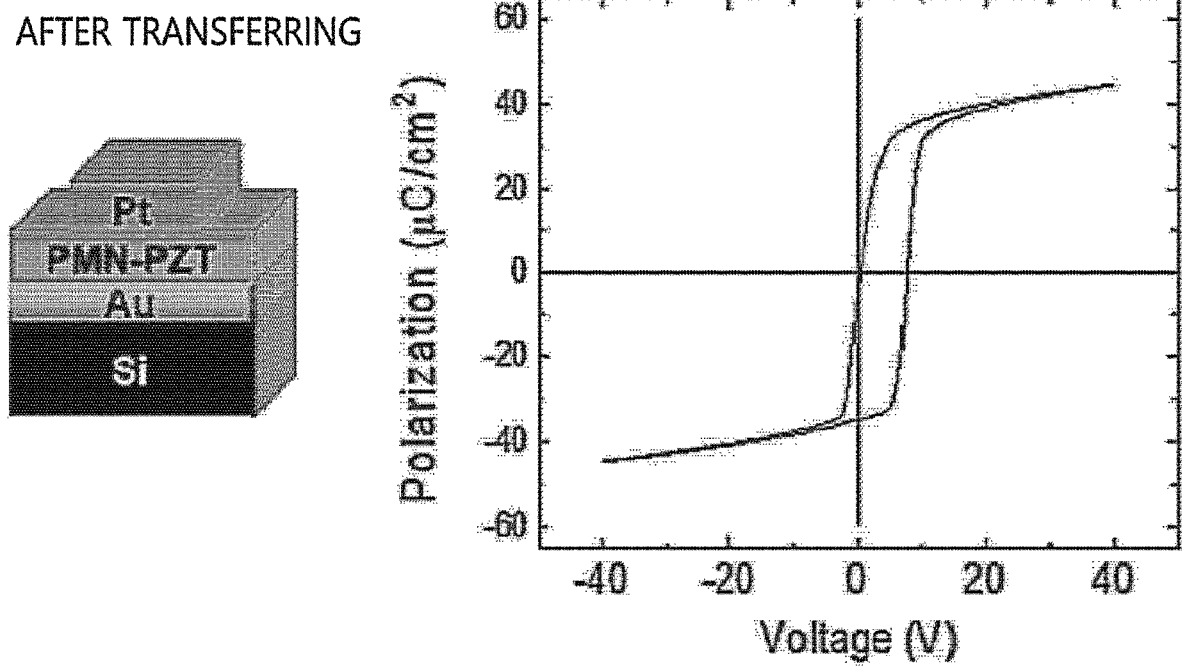
FIG. 12 is a graph concerning polarization versus voltage after transferring according to the semiconductor substrate with oxide single crystal heterostructures of the present invention.

Furthermore, FIG. 11 and FIG. 12 show graphs of polarization versus voltage before and after transfer of the semiconductor substrate with oxide single crystal heterostructures of the present invention, and it can be confirmed that the PMN-PZT layer, which is the epitaxy oxide thin film layer 30, shows an imprint characteristic of being horizontally transferred in a negative direction before transferring, whereas the PMN-PZT layer after transferring is horizontally transferred in a positive direction.

These results are caused by the fact that an upper part and a lower part of the PMN-PZT layer during imprinting are changed, and are favorable results with respect to improvement of high-quality piezoelectric capability and stability.

Accordingly, the present invention provides an electronic device comprising a semiconductor substrate with oxide single crystal heterostructures in which an epitaxy oxide thin film layer is bonded to a semiconductor substrate via a metal layer.

Specifically, the semiconductor substrate with oxide single crystal heterostructures may be applied to a sensor, an actuator, a transducer, or a microelectromechanical system (MEMS) as well as an electrical and electronic device or an optical device.

The present invention is described below in more detail with reference to the examples.

The examples are intended for more specifically describing the present invention, and a scope of the present invention should not be limited to these examples.

<Example 1> Production of a Specimen
(PMN-PZT Single Crystal
Piezoelectric-Layer/Metal Layer/Si)

A sacrificial layer, $(La_{0.67}, Sr_{0.33})MnO_3$ (LSMO, 40) of 50 nm grew into an epitaxy thin film on a single crystal substrate 50 of $SrTiO_3$ through a PLD process. PMN-PZT layer of 1.2 μm grew into an epitaxy oxide thin film layer 30 on LSMO layer through a sputtering process, and a chemical mechanical polishing (CMP) process was performed in order to reduce surface roughness. After this, a metal layer including Ti layer of 10 nm as a metal bonding layer, and Au layer of 120 nm as a metal transferring layer successively grew through a thermal evaporation process.

A metal layer (Au/Ti) was also formed on a silicon substrate 10 to be transferred using a vacuum deposition process. The silicon substrate and Au surface formed on the PMZ-PZT layer were bonded to each other after oxygen plasma treatment. 5 MPa of a pressure was applied thereto using pressing for 15 minutes, and after completion of metal bonding, the specimen was put into a solution, the sacrificial layer of LSMO was selectively etched so that the PMN-PZT layer could be separated from the $SrTiO_3$ substrate and could be transferred onto the silicon substrate, and as a result, the semiconductor substrate with oxide single crystal heterostructures was manufactured.

<Example 2> Production of a Specimen
(PMN-PZT Single Crystal
Piezoelectric-Layer/Metal Layer/Si)

A semiconductor substrate with oxide single crystal het-
erostructures was manufactured in the same manner as that
shown in said Example 1 except the fact that a photo
lithography process was performed with respect to an epi-
taxy oxide thin film layer 31 and a metal layer (Au/Ti)
formed to be piled up from a single crystal substrate of
SrTiO₃ 50 so that a photo resist pattern of 100×100 μm could
be formed, and a process of etching the metal layer (Au/Ti)
and the PMN-PZT layer through a wet etching process was
further performed.

<Experimental Example 1> Analysis of X-Ray
Diffraction Before and After Transferring
According to the Semiconductor Substrate with
Oxide Single Crystal Heterostructures With respect to the specimen (PMN-PZT/Ti/Au/Ti/Si)
which is the semiconductor substrate with oxide single
crystal heterostructures manufactured in said Example 1, the
analysis of high-resolution X-ray diffraction using a wave-
length ($\lambda$=1.540562 Å) of Cu $K_{\alpha 1}$ radiation was performed
under Bragg-Brentano's condition.

As a result thereof, as presented in FIG. 9 and FIG. 10,
from the structure before transferring (PMN-PZT/LSMO
(sacrificial layer)/STO (oxide single crystal substrate)), it
could be confirmed that the PMZ-PZT layer and the sacri-
ficial layer of LSMO had grew into a single crystal having
an orientation of (001) plane on the substrate of SrTiO₃.
Also, from the structure after transferring (PMN-PZT/
Au&Ti (metal layer)/Si(semiconductor substrate), it was
confirmed that the epitaxy oxide thin film layer of PMN PZT
having an orientation of (001) plane as well as the metal
layer preferentially oriented in a direction of (111) plane had
been formed on the silicon substrate. Accordingly, it was
confirmed that the semiconductor substrate 10 to which the
epitaxy oxide thin film layer 30 had been bonded via the
metal layer 20 had been produced.

<Experimental Example 2> Valuation on
Ferroelectric Capability of the Semiconductor
Substrate with Oxide Single Crystal
Heterostructures With respect to the specimen (PMN-PZT/Ti/Au/Ti/Si)
which is the semiconductor substrate with oxide single
crystal heterostructures manufactured in said Example 1,
ferroelectric capability of the materials was valued using
machinery, Precision Premier II (by RADIANT TECH-
NOLOGIES. INC.).

As a result, through the graphs shown in FIG. 11 and FIG.
12 concerning voltage versus polarization before and after
transferring according to the semiconductor substrate with
oxide single crystal heterostructures according to the present
invention, it was confirmed that a ferroelectric property of
the epitaxy oxide thin film layer of PMN-PZT had been well
maintained even after transferring.

The PMN-PZT epitaxial oxide thin film layer shows
imprint characteristics horizontally shifted in the negative
direction before transfer, whereas it shows a tendency to
horizontal shift in the positive direction after transfer. This
result is caused by the fact that an upper part and a lower part
of the epitaxy oxide thin film layer of PMN-PZT are
changed during transferring. Therefore, since the imprint phenomenon is maintained, it can be expected to improve
the stability of the piezoelectric performance when manu-
facturing devices such as piezoelectric MEMS devices,
actuators, sensors, or transducers in the future.

As described above, although the embodiments of the
present invention have been disclosed for illustrative pur-
poses, those skilled in the art will obviously appreciate that
various variations and modifications are possible, within the
scope of the technical spirit of the present invention.

EXPLANATION OF NUMBERS

1, 2: semiconductor substrate with oxide single crystal
heterostructures
10, 11: semiconductor substrate
20, 20A, 20B, 21, 21A, 21B: metal layer
30, 31: epitaxy oxide thin film layer
40: sacrificial layer
50: oxide single crystal substrate
What is claimed is:
1. A semiconductor substrate assembly having oxide
single crystal heterostructures, comprising:
a metal layer disposed on a semiconductor substrate; and
an epitaxially grown oxide single crystal thin film layer
having a perovskite structure bonded to the semicon-
ductor substrate via the metal layer,
wherein the epitaxially grown oxide single crystal thin
film layer has crystallinity with a full width at half
maximum (FWHM) of 0.1° or below when measured
by an omega rocking curve at a peak of highest
diffraction peak intensity in θ–2θ mode of an X-ray
diffractometer,
wherein the epitaxially grown oxide single crystal thin
film layer is a pore-free thin film layer composed of a
perovskite piezoelectric oxide, and
wherein the epitaxially grown oxide single crystal thin
film layer is formed on a sacrificial layer and trans-
ferred to the metal layer bonded to the semiconductor
substrate.
2. The semiconductor substrate assembly of claim 1,
wherein the metal layer has a laminated structure in which
layer A, layer B, and layer A' are laminated in order, the layer
A and the layer A' are metal adhesion layers having a
thickness of 5 to 20 nm, and the layer B is a metal bonding
layer having a thickness of 20 nm to 1 μm.
3. The semiconductor substrate assembly of claim 1,
wherein a total thickness of the metal layer is 5 to 1500 nm.
4. The semiconductor substrate assembly of claim 1,
wherein the epitaxially grown oxide single crystal thin film
layer is a thin film formed in a thickness of 10 μm or more.
5. The semiconductor substrate assembly of claim 1,
wherein the epitaxially grown oxide single crystal thin film
layer is patterned into a plurality of lattice cells.
6. The semiconductor substrate assembly of claim 1,
wherein the metal layer has a single layer structure or a
laminated structure composed of one element, or two or
more elements selected from the group consisting of Au, Al,
W, Ti, Cr, Pt, Cu, Ni, Mo, Ta, Nb, and La.
7. The semiconductor substrate assembly of claim 6,
wherein the laminated structure is a structure in which layer
A, layer B, and layer A' are laminated in order, the layer A
and the layer A' are identical to or different from each other
and are any one selected from the group consisting of Ti, Cu,
Ni, Pt, and Cr, and the layer B is any one selected from the
group consisting of Au, Mo, Ta, Nb, La, W, and CuW.
8. An electronic device, comprising the semiconductor
substrate assembly of claim 1.

9. The electronic device of claim 8, wherein the semiconductor substrate assembly is applied to any one of an electric and electronic device, an optical device, a sensor, an actuator, a transducer, or a microelectromechanical system (MEMS).

10. The semiconductor substrate assembly of claim 1, wherein the epitaxially grown oxide single crystal thin film layer is composed of a perovskite piezoelectric oxide whose lattice constant is 0.3 to 0.45 nm.

11. The semiconductor substrate assembly of claim 10, wherein the perovskite piezoelectric oxide is composed of any one selected from the group consisting of $Pb(Mg_{1/3}, Nb_{2/3})O_3$, $PbZrO_3$, $PbTiO_3$, $SrTiO_3$, $SrRuO_3$, $BaTiO_3$, and $BiFeO_3$, or a solid solution thereof, or a material to which a dopant is added.

12. The semiconductor substrate assembly of claim 10, wherein the perovskite piezoelectric oxide comprises a piezoelectric single crystal having a perovskite-type crystal structure ($ABO_3$) with a compositional formula of Chemical Formula 1 below:

$$[A_{1-(a+1.5b)}B_aC_b][(MN)_{1-x-y}(L)_yTi_x]O_3 \qquad \text{Chemical Formula 1}$$

in the formula, A represents Pb or Ba,

B represents at least one or more elements selected from the group consisting of Ba, Ca, Co, Fe, Ni, Sn and Sr, C represents at least one or more elements selected from the group consisting of Co, Fe, Bi, La, Ce, Pr, Nd, Pm, Sm, Eu, Gd, Tb, Dy, Ho, Er, Tm, Yb and Lu, L has a single form composed of one element selected from Zr or Hf, or a mixed form thereof, M represents at least one or more elements selected from the group consisting of Ce, Co, Fe, In, Mg, Mn, Ni, Sc, Yb and Zn, N represents at least one or more elements selected from the group consisting of Nb, Sb, Ta and W, a, b, x, and y satisfy the following requisites:
$0 < a \leq 0.10$,
$0 < b \leq 0.05$,
$0.05 \leq x \leq 0.58$, and
$0.05 \leq y \leq 0.62$.

13. The semiconductor substrate assembly of claim 12, wherein in the formula the piezoelectric single crystal satisfies the requisites of $0.01 \leq a \leq 0.10$ and $0.01 \leq b \leq 0.05$.

* * * * *